(12) United States Patent
Jeng

(10) Patent No.: US 6,559,009 B2
(45) Date of Patent: May 6, 2003

(54) METHOD OF FABRICATING A HIGH-COUPLING RATIO FLASH MEMORY

(75) Inventor: Pei-Ren Jeng, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/820,303

(22) Filed: Mar. 29, 2001

(65) Prior Publication Data

US 2002/0142542 A1 Oct. 3, 2002

(51) Int. Cl.$^7$ .......................................... H01L 21/8246
(52) U.S. Cl. ....................................... 438/258; 438/697
(58) Field of Search ................................ 438/258, 241, 438/697, FOR 212

(56) References Cited

U.S. PATENT DOCUMENTS

| | | | | |
|---|---|---|---|---|
| 5,015,602 A | * | 5/1991 | Van Der Plas et al. | 438/424 |
| 5,728,621 A | * | 3/1998 | Zheng et al. | 438/221 |
| 5,962,889 A | * | 10/1999 | Yamauchi et al. | 257/317 |

OTHER PUBLICATIONS

Wolf S. "Silicon Processing for the VLSI–ERA: vol. 2–Process Integration", 1990, Lattice Pr., vol. 2, pp. 222–223.*

* cited by examiner

Primary Examiner—George Fourson
Assistant Examiner—Suk-San Foong
(74) Attorney, Agent, or Firm—Winston Hsu

(57) ABSTRACT

The present invention provides a method of fabricating a flash memory. The method first involves forming a gate oxide layer on a silicon substrate of a semiconductor wafer. Then, a first polysilicon layer, and a silicon nitride layer are formed, respectively, on the gate oxide layer. A lithographic process is then used to pattern a first photoresist layer for defining a memory array area and a peripheral region. The first photoresist layer is then used to etch the silicon nitride layer down to the surface of the silicon substrate to form a wide gap at the boundary between the memory array area and the peripheral region, and a plurality of gaps in the memory array area. An HDP oxide layer is then deposited, followed by coating of a photoresist (PR) on the wafer to achieve cell planarization. Thereafter, an oxide etch back process is performed followed by stripping of both the PR coating and the silicon nitride layer. Finally, a floating gate and a control gate are formed, respectively.

7 Claims, 8 Drawing Sheets

METHOD OF FABRICATING A HIGH-COUPLING RATIO FLASH MEMORY

BACKGROUND OF THE INVENTION

1. Field of the Invention

The present invention relates to a method of fabricating a high-coupling ratio flash memory array, and more particularly, to a method of planarizing a flash memory to prevent CMP dishing, to increase cell uniformity and to increase the coupling ratio between the floating gate and the control gate.

2. Background of the Invention

In a flash memory cell, an initial memory array and a peripheral region are first defined on a silicon substrate. The initial memory array typically includes columns of polysilicon lines (also referred to as Poly-1 lines) and a plurality of gaps formed therein between two adjacent Poly-1 lines. The Poly-1 lines of the memory array function as a bottom portion of a floating gate of the flash memory. A high-density plasma chemical vapor deposition (HDPCVD) process is normally performed to deposit an HDP oxide layer over the memory array and partially filling the gaps. In most cases, each Poly-1 line comprises an additional nitride cap layer formed on its surface. A chemical mechanical polishing process (CMP) is thereafter used to achieve cell planarization for facilitation of subsequent processes using the nitride cap layer as a polishing stop layer.

In manufacture of the flash memory, uniformity of thickness of the HDP oxide layer at the bottom of each gap between two adjacent Poly-1 lines (hereinafter referred to as bottom thickness) is of primary concern for flash memory cell performance. In regards to the deposition variation of the bottom thickness of the HDP oxide layer, the typical uniformity variation at one sigma statistical standard deviation of error is approximately 2% ($\pm 1\sigma$). The use of the CMP process exacerbates the decrease in uniformity as device packing density increases, and is likely due to the well-known dishing effects. Typically, the uniformity variation at one sigma statistical standard deviation resulting from the use of the CMP process is approximately 3–4% ($\pm 1\sigma$), to thereby produce an undesirable total variation of about 4% ($\pm 1\sigma$).

Please refer to FIG. 1 to FIG. 7 of the cross-sectional diagrams of fabricating a flash memory cell on a semiconductor wafer 10 according to the prior art. As shown in FIG. 1, a gate oxide layer 14 is first formed on a silicon substrate 12 of a semiconductor wafer 10. Next, a polysilicon layer 16, and a silicon nitride cap layer 18 are formed, respectively, on the gate oxide layer 14. As shown in FIG. 2, a lithographic process is then used to pattern a photoresist layer 20 for defining a peripheral region 15 and a memory array area 17. As shown in FIG. 3, using the photoresist layer 20 as a hard mask the silicon nitride cap layer 18 and the polysilicon layer 16 are etched to form columns of capped Poly-1 lines 21. As well, a wide gap 22 is produced between the peripheral region 15 and the memory array area 17, and a plurality of gaps 23 are formed in the memory array area 17 between two adjacent Poly-1 lines 21. The photoresist layer 20 is then removed.

As shown in FIG. 4, after the removal of the photoresist layer 20, a high-density plasma chemical vapor deposition (HDPCVD) process is then performed to deposit an HDP oxide layer 24 on the surface of the semiconductor wafer 10 and filling in both the gap 22 and the gaps 23. As shown in FIG. 5, a chemical mechanical polishing (CMP) process is then performed to remove the portion of the HDP oxide layer 24 atop the Poly-1 lines 21 and achieve cell planarization. As shown in FIG. 6, a wet etching process, such as hot phosphoric acid etching, is used to completely remove the silicon nitride layer 18 to expose the underlying polysilicon layer 16. ACVD process is then performed to deposit a polysilicon layer 26, followed by the deposition of a photoresist layer 28 and then its patterning by a conventional lithographic process.

As shown in FIG. 7, the photoresist layer 28 is used as a hard mask to etch the polysilicon layer 26 down to the surface of the HDP oxide layer 24 to form a floating gate 29. The floating gate 29 is formed of both the polysilicon layers 26, 16. After the removal of the photoresist layer 28, a thin oxide-silicon-oxide (ONO) dielectric layer 32 is formed on the surface of the semiconductor wafer 10 and covering both the HDP oxide layer 24 and the floating gate 29. Finally, a doped polysilicon layer 34 is formed over the ONO dielectric layer 32 to form the control gate.

In the prior art, the dishing effects that occur in the CMP process greatly affect the uniformity of the bottom thickness of the HDP oxide layer 24. The occurrence of dishing can also lead to erosion of the exposed Poly-1 line 21 near the wide gap 22. As a result, both dishing and a decrease in uniformity of the bottom thickness affect the electrical performance and reliability of the flash memory cell.

SUMMARY OF THE INVENTION

It is therefore a primary objective of the present invention to provide a method of cell planarization to prevent dishing, increase the uniformity of HDP thickness as well as to increase the coupling ratio of the floating and control gate to effectively enhance the performance of the flash memory cell.

In the present invention, a gate oxide layer is first formed on a silicon substrate of a semiconductor wafer. Then, a first polysilicon layer, and a silicon nitride cap layer are deposited, respectively, on the gate oxide layer. A lithographic process is then used to pattern a first photoresist layer and define a memory array area and a peripheral region. The first photoresist layer is then used as a hard mask to etch the silicon nitride cap layer and the first polysilicon layer to form columns of silicon-capped poly lines. Also, a wide gap is formed at the boundary between the memory array area and the peripheral region, and a plurality of gaps are formed in the memory array area. Following removal of the first photoresist layer, an HDP oxide layer is then deposited over the surface of the semiconductor wafer via an HDP deposition process. Next, a photoresist (PR) is coated over the HDP oxide layer and filling the gaps to achieve cell planarization. Thereafter, an oxide etch back process is performed to remove a portion of the PR coating. A stripping process is then used to strip both the PR coating and the silicon nitride layer to expose both the surface of the first polysilicon layer and that of the HDP oxide layer.

The method of the present invention replaces the prior art use of chemical mechanical polishing with the coating of a photoresist in order to achieve cell planarization. As a result, dishing is prevented and the standard deviation of error occurring from the use of the CMP process is removed to increase the electrical performance of the flash memory cell. Also, following cell planarization and stripping of both the PR coating and the silicon nitride layer, the ends of the HDP oxide layer block allow for a greater contact surface between the floating gate and the control gate. As a result, the coupling ratio between the gates increases to thereby improve the read/write speed of the flash memory.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
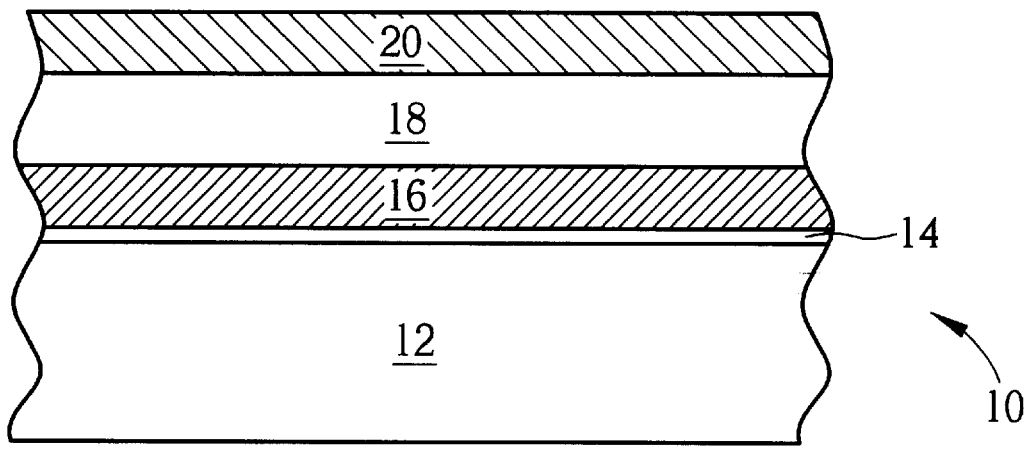
FIG. 1 to FIG. 7 are the cross-sectional diagrams of the method of fabricating a flash memory according to the prior art.
Figure 2:
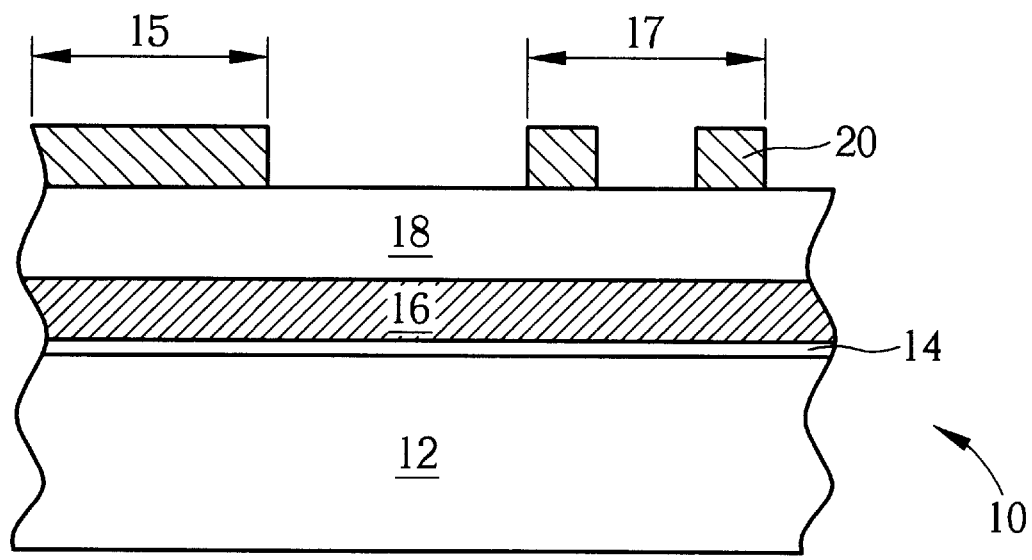
Figure 3:
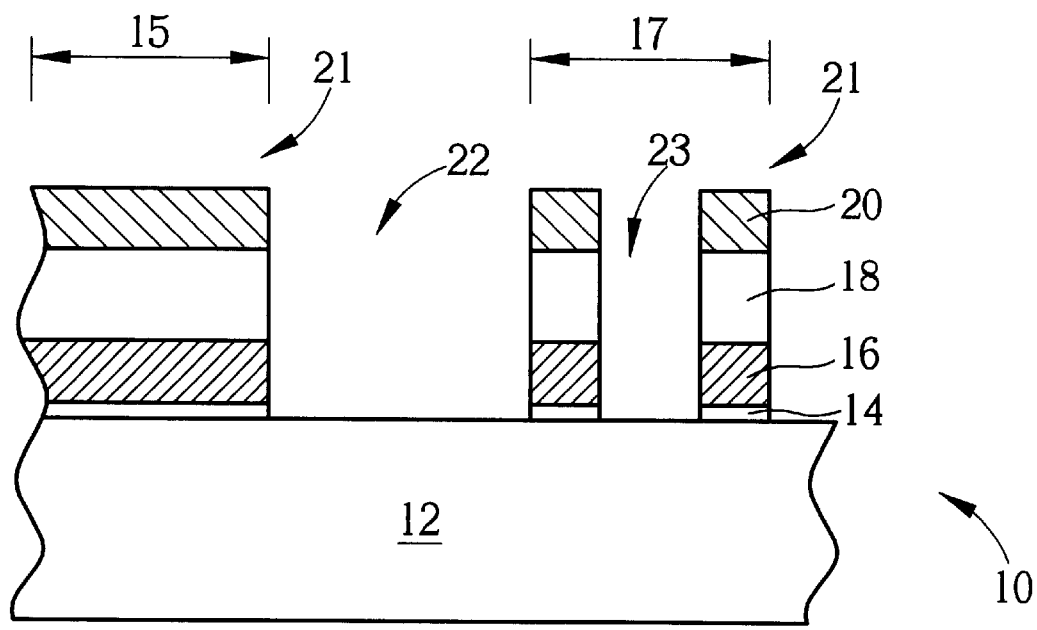
Figure 4:
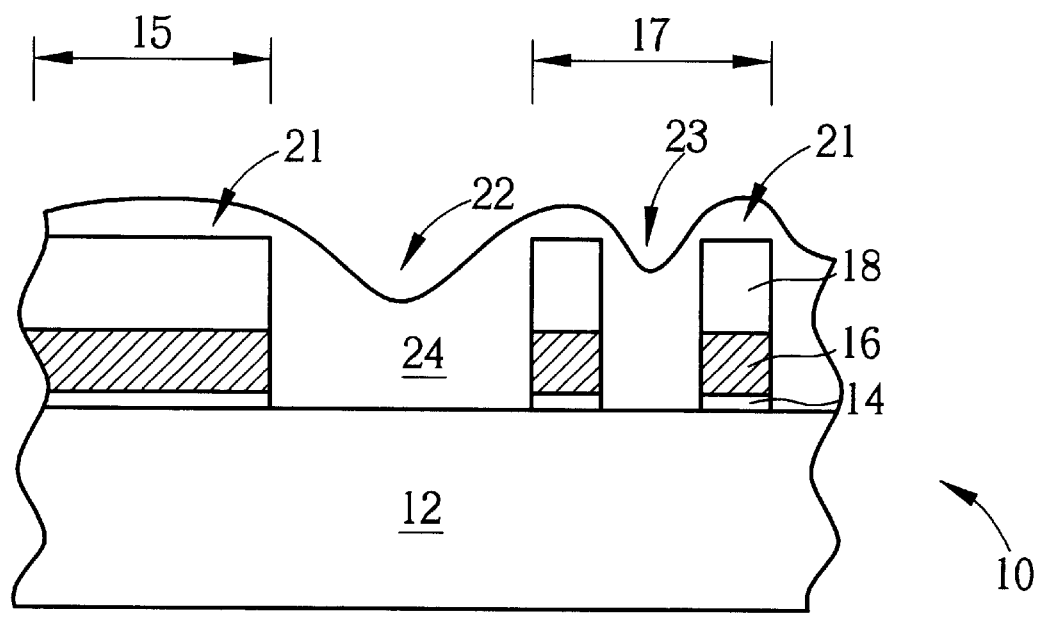
Figure 5:
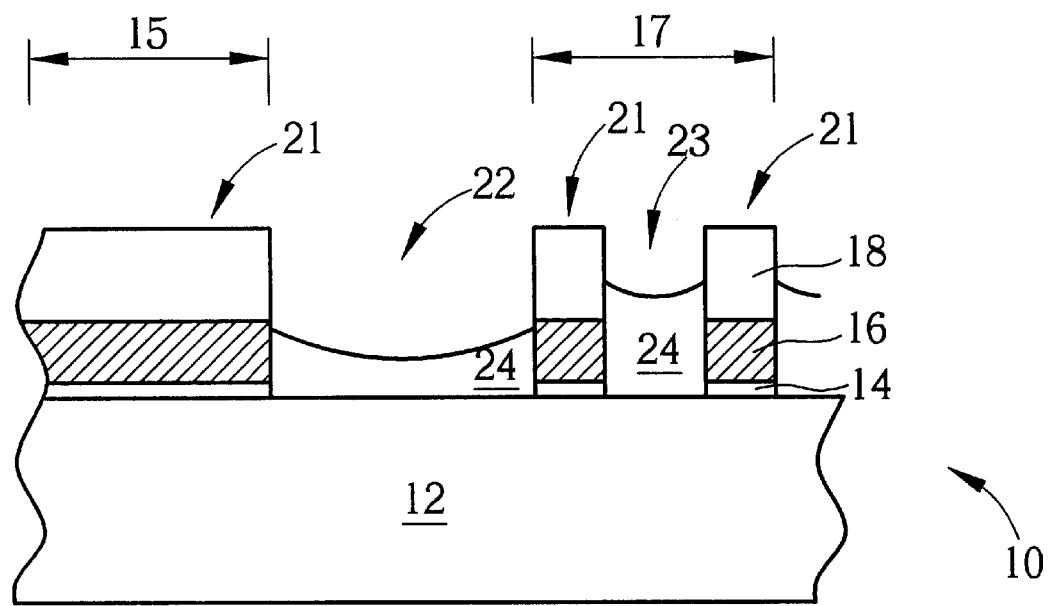
Figure 6:
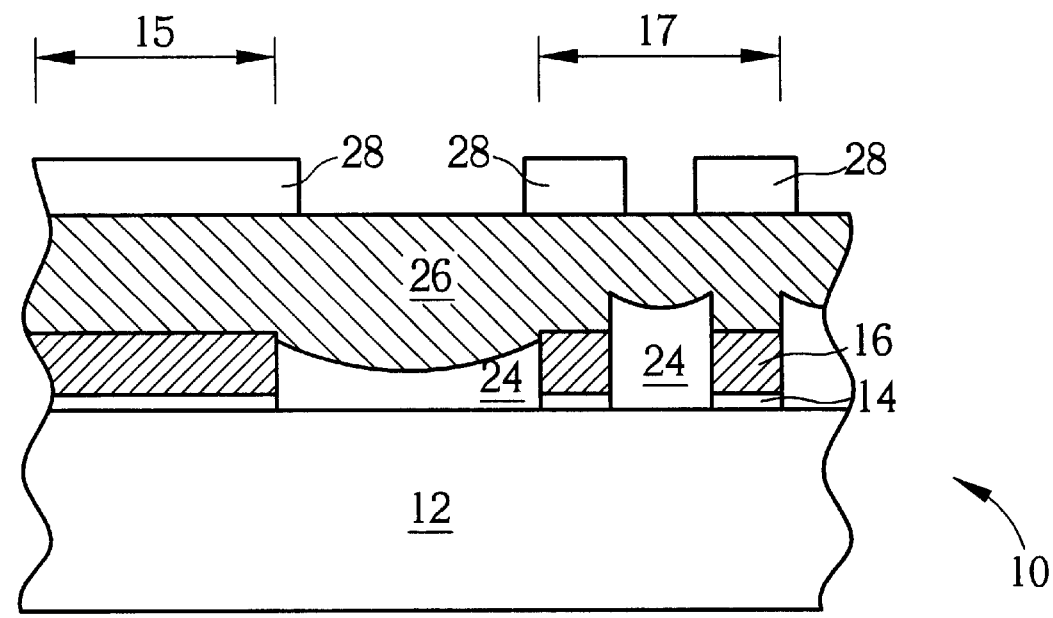
Figure 7:
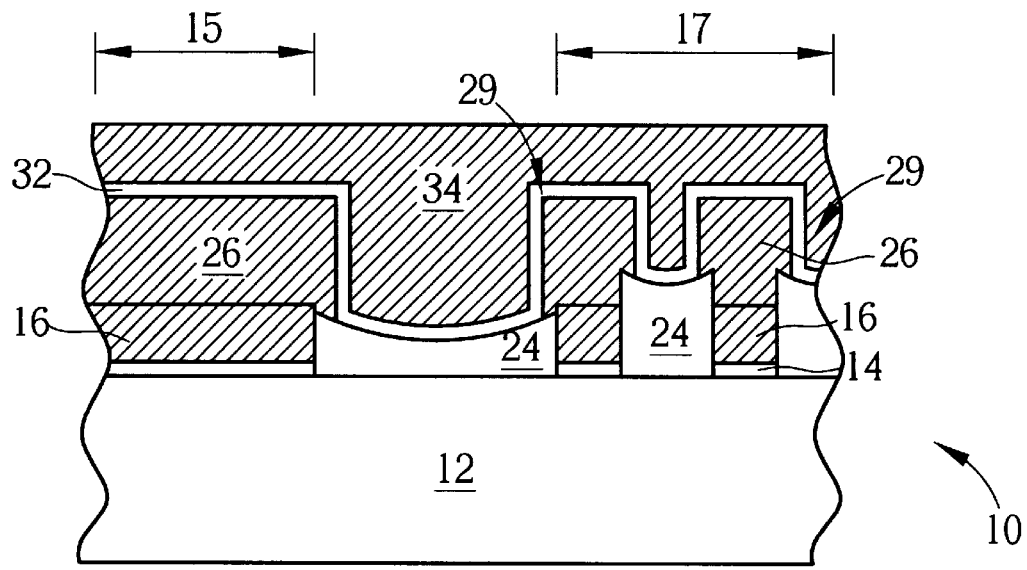
Figure 8:
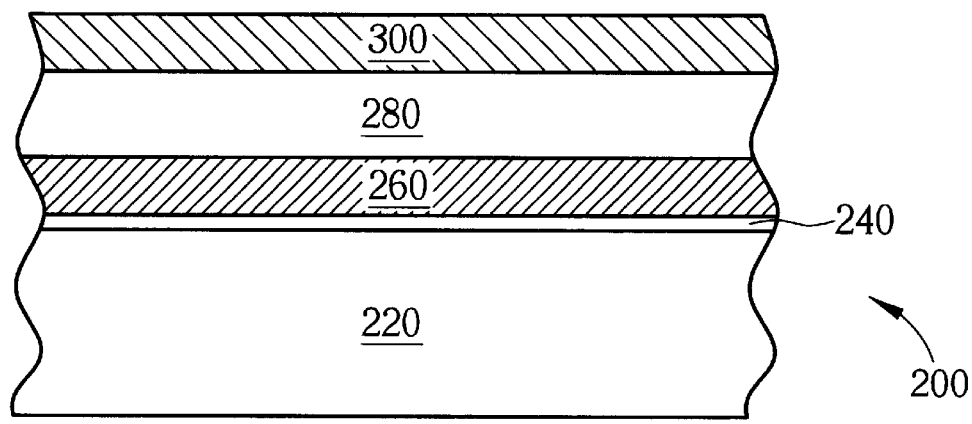
FIG. 8 to FIG. 16 are the cross-sectional diagrams of the method of fabricating a flash memory according to the present invention.
Figure 9:
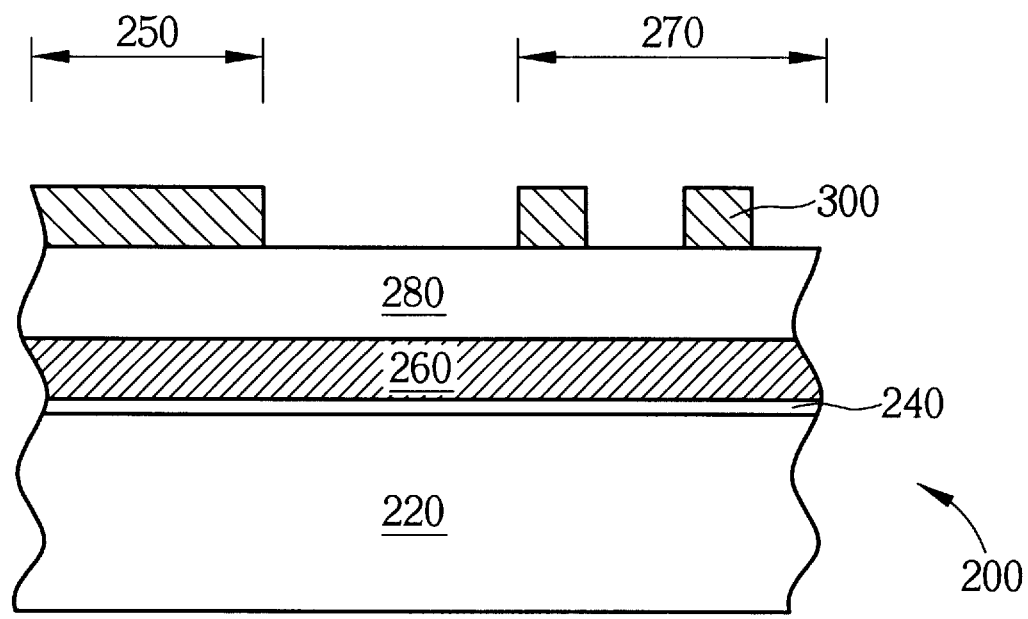
Figure 10:
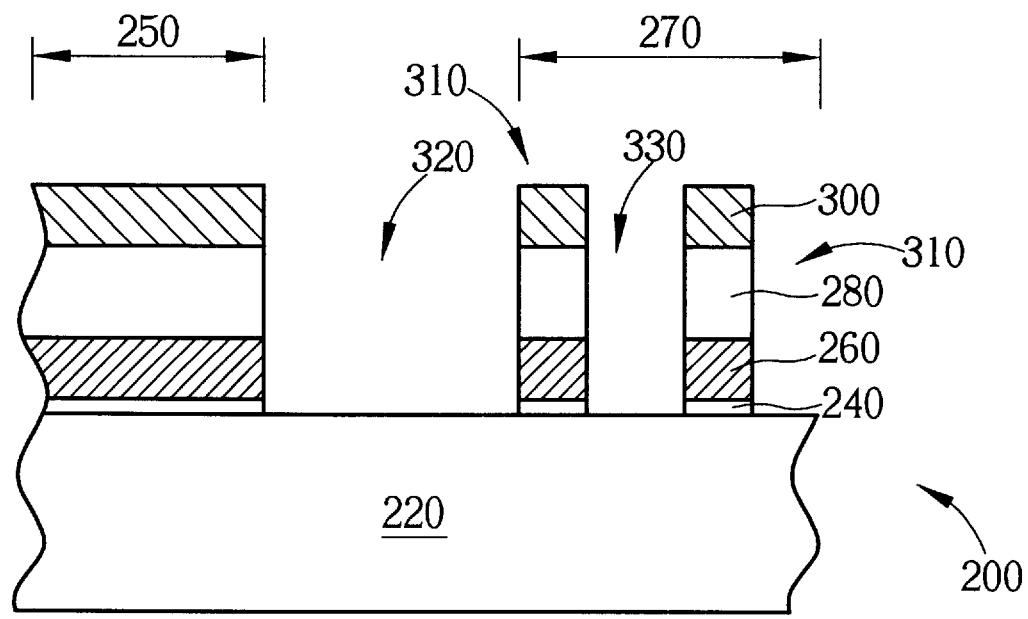

Please refer to FIG. 8 to FIG. 16 of the cross-sectional diagrams of the method of cell planarization of a flash memory according to the present invention. As shown in FIG. 8, a gate oxide layer 240 is first formed on a silicon substrate 220 of a semiconductor wafer 200. Next, a first polysilicon layer 260, and a silicon nitride cap layer 280 are formed, respectively, on the gate oxide layer 240. As shown in FIG. 9, a lithographic process is then used to pattern a photoresist layer 300 for defining a peripheral region 250 and a memory array area 270. As shown in FIG. 10, the photoresist layer 300 is then used as a hard mask to etch the silicon nitride cap layer 280 and the first polysilicon layer 260 to form columns of capped Poly-1 lines 310. As well, a wide gap 320 is formed between the peripheral region 250 and the memory array area 270, and a plurality of gaps 330 are formed in the memory array area 270. Buried bit lines (not shown) are then implanted into the silicon substrate 220, followed by the use of an annealing procedure at a temperature between 800–1050° C.

Figure 11:
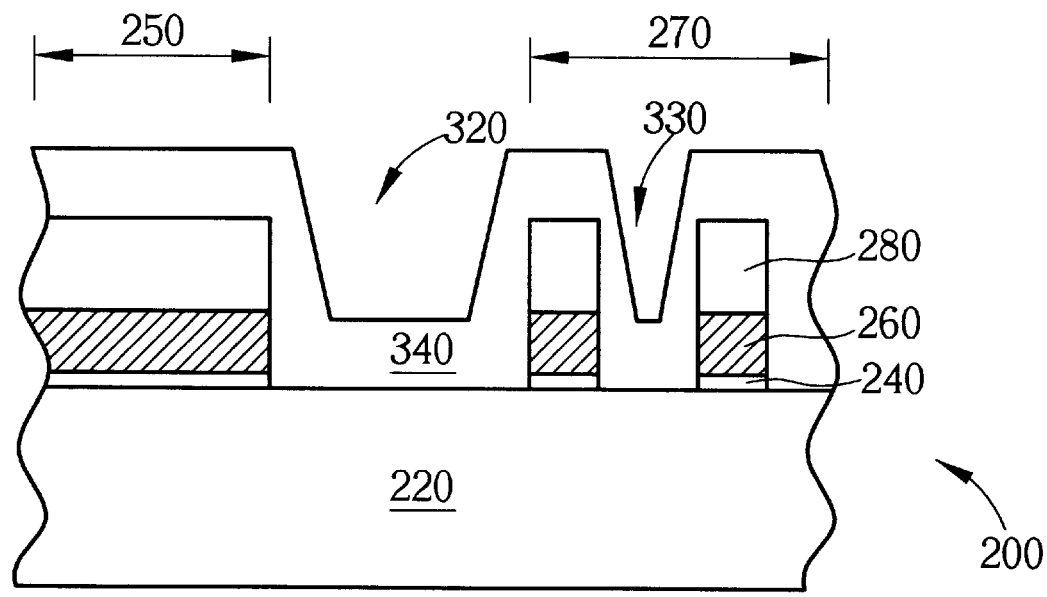
Figure 12:
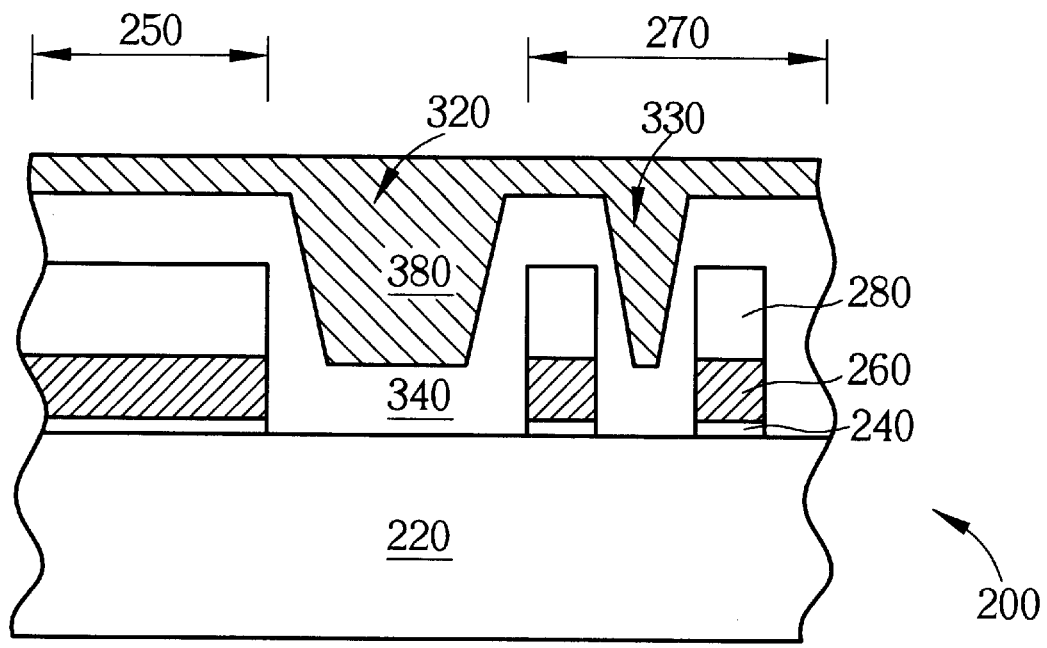

As shown in FIG. 11, after the removal of the photoresist layer 300, a high-density plasma chemical vapor deposition (HDPCVD) process is then performed to deposit an HDP oxide layer 340 on the surface of the semiconductor wafer 200 and filling the gaps 320, 330 with a bottom thickness of approximately 1500 angstroms. As shown in FIG. 12, a photoresist (PR) layer 380 is coated over the HDP oxide layer 340 and filling the gaps 320, 330 to achieve cell planarization. The photoresist layer 380 maybe composed of materials commonly used by a person skilled in the art. Then, the PR coating 380 undergoes a soft/hard bake process for solvent removal and curing, respectively.

Figure 13:
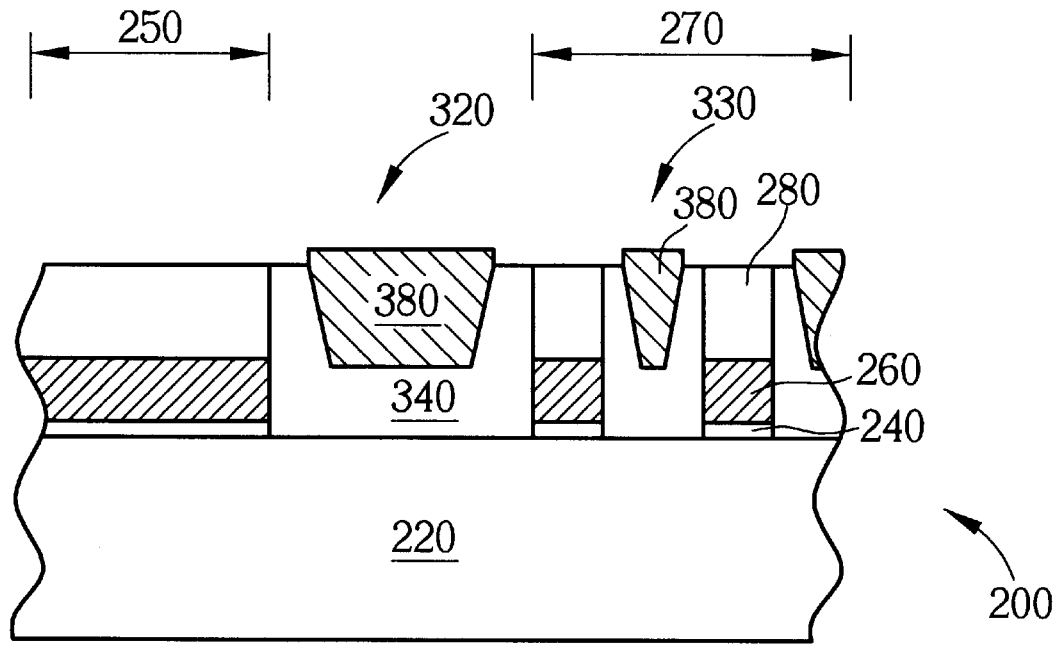
Figure 14:
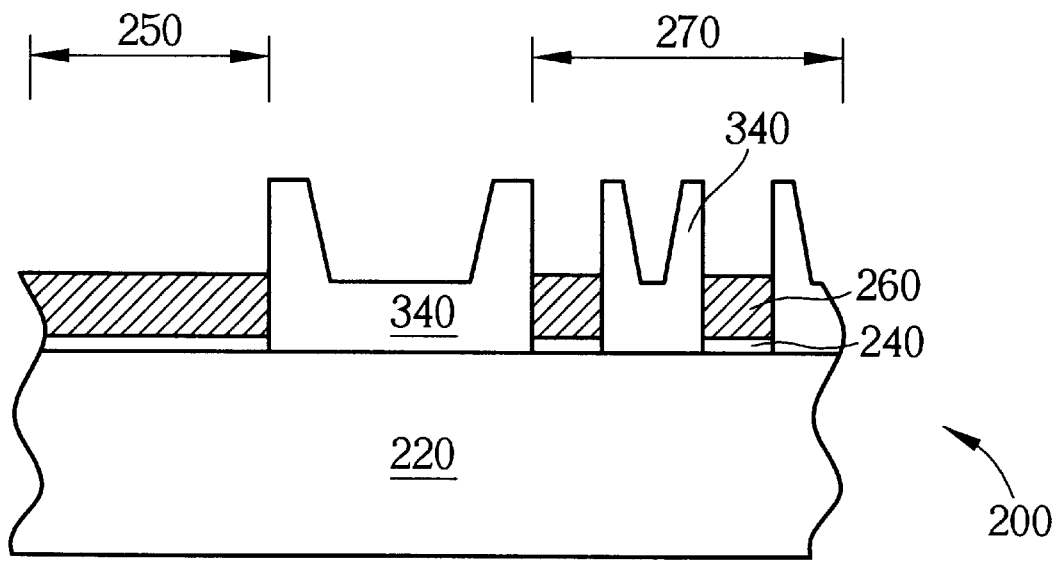

As shown in FIG. 13, an oxide etch back process is performed to remove a portion of both the PR coating 380 and the HDP oxide layer 340. As shown in FIG. 14, an oxygen plasma etching process, using for example a stripping plasma, is then used to strip the PR coating, and a wet etching process, using for example a hot phosphoric acid solution, is used to remove the silicon nitride layer 280. As a result, both the surface of the first polysilicon layer 260 and that of the HDP oxide layer 340 are exposed and form an alternating pattern of first polysilicon layer 260 and HDP oxide layer 340 blocks. The ends of each HDP oxide layer 340 block protrude from the relatively planar surface and function in increasing the CR between the floating gate and the control gate in a subsequent process. The bottom thickness of the non-ended HDP oxide layer blocks 340 is approximately 1500 angstroms.

Figure 15:
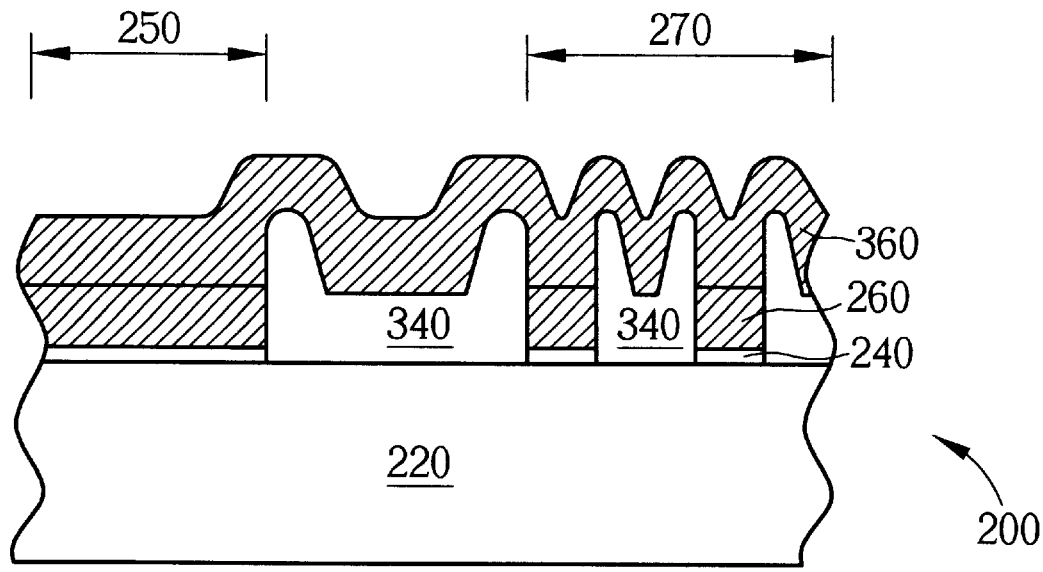

As shown in FIG. 15, the ends of each HDP oxide layer 340 are subjected to a quick hydrofluoric acid (HF) dip to selectively remove portions of the ends so as to produce a surface-rounding effect. A second polysilicon layer 360 is then deposited over the silicon substrate 220 and completely covers the surfaces of both the HDP oxide layer 340 blocks and the first polysilicon 260 layer blocks. Next, a patterned second photoresist layer (not shown) is formed over the second polysilicon layer 360 and is used as a hard mask to etch the second polysilicon layer 360 down to the surface of the HDP oxide layer 340 to form a floating gate 370.

Figure 16:
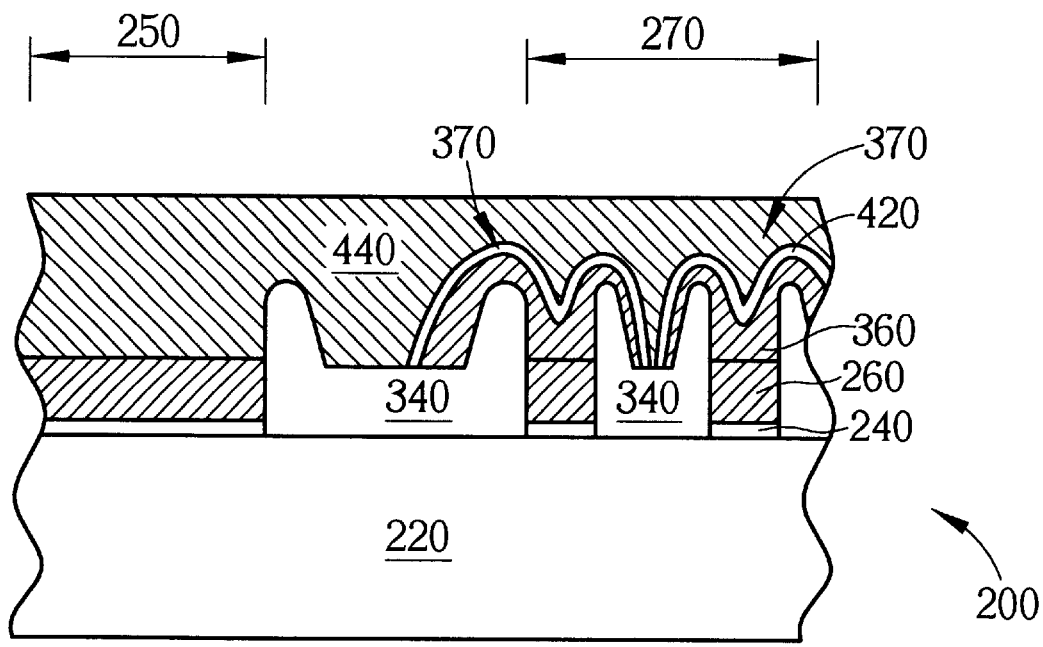

As shown in FIG. 16, the floating gate 370 is formed of both the polysilicon layers 260, 360. After the removal of the second the photoresist layer, a thin oxide-silicon-oxide (ONO) dielectric layer 420 is formed on the surface of the semiconductor wafer 200 and covers both the HDP oxide layer 340 and the floating gate 370. Finally, a doped polysilicon layer 440 is formed over the ONO dielectric layer 420 to form a control gate.

In contrast to the prior art method of cell planarization for a flash memory cell, the cell planarization method of the present invention prevents the problem of dishing and nonuniformity of HDP oxide deposition that occurs following the use of the chemical mechanical polishing process to planarize a cell. Instead of chemical mechanical polishing, as used in the prior art, the present invention achieves cell planarization via the coating of a photoresist. As a result, dishing is prevented and the uniformity variation of 3–4% incurred during the CMP process is eliminated to increase the uniformity of HDP oxide thickness within the gaps. Moreover, following the cell planarization of the present invention, a higher coupling ratio is achieved between the floating gate and the control gate due to the formation of ends on the HDP oxide layer block to increase the contact area between the two gates. As a result, a greater read/write speed is achieved in the flash memory.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of fabricating a flash memory cell, the method comprising:

providing a substrate;

forming a gate oxide layer on the substrate;

depositing a first polysilicon layer, and a silicon nitride cap layer, respectively, on the gate oxide layer;

performing a lithographic process to pattern a first photoresist layer for defining both a memory array and a peripheral region on the silicon nitride cap layer;

using the first photoresist layer as a mask to etch the silicon nitride cap layer and the first polysilicon layer to form columns of capped poly lines, wherein a wide gap is formed at the boundary between the memory array area and the peripheral region, and a plurality of gaps are formed in the memory array area;

performing a high-density plasma chemical vapor deposition (RDPCVD) process to form an HOP oxide layer over the substrate to coat inner surfaces of the gaps with a bottom thickness;

coating a photoresist on the oxide layer such that the gaps are filled with the HDP oxide layer and the photoresist coating;

performing an oxide etch beck process to selectively remove a portion of the photoresist coating and a portion of the HDP oxide layer to expose the silicon nitride cap layer;

performing an oxygen plasma etching process to remove the photoresist coating; and performing a wet etching process to remove the silicon nitride cap layer and so as to form at least one protruding portion of the HDP oxide layer.

2. The method of claim 1 wherein the substrate is a silicon substrate.

3. The method of claim 1 wherein the thickness of the first polysilicon layer is approximately 1000 angstroms.

4. The method of claim 1 wherein the thickness of the silicon nitride cap layer is approximately 2000 angstroms.

5. The method of claim 1 wherein the bottom thickness of the HDP oxide layer within the gaps are approximately 1500 angstroms.

6. The method of claim 5 wherein the uniformity variation at one sigma standard deviation of error of the bottom thickness of the HDP oxide layer is approximately 2% ($\pm 1\sigma$).

7. The method of claim 1 wherein the oxide etch back process is a plasma dry etching process.

* * * * *